United States Patent [19]
Kirsch et al.

[11] Patent Number: 6,091,264
[45] Date of Patent: Jul. 18, 2000

[54] SCHMITT TRIGGER INPUT STAGE

[75] Inventors: Howard C. Kirsch, Austin, Tex.;
Yen-Tai Lin; Yu-Ming Hsu, both of Hsinchu, Taiwan

[73] Assignee: Vanguard International Semiconductor Corporation, Hsin-Chu, Taiwan

[21] Appl. No.: 09/085,613

[22] Filed: May 27, 1998

[51] Int. Cl.[7] .................... H03K 19/0175; H03K 19/094
[52] U.S. Cl. .......................... 326/70; 326/71; 326/119; 326/121
[58] Field of Search .................... 326/70, 71, 65, 326/76, 119, 121

[56] References Cited

U.S. PATENT DOCUMENTS

| | | | |
|---|---|---|---|
| 4,437,025 | 3/1984 | Liu et al. | 307/475 |
| 4,568,844 | 2/1986 | O'Connor | 307/475 |
| 4,612,461 | 9/1986 | Sood | 326/34 |
| 5,036,226 | 7/1991 | Tonnu et al. | 326/71 |
| 5,144,167 | 9/1992 | McClintock | 326/71 |
| 5,386,153 | 1/1995 | Voss et al. | 326/34 |
| 5,455,520 | 10/1995 | Honda | 326/17 |
| 5,578,941 | 11/1996 | Sher et al. | 326/34 |
| 5,612,635 | 3/1997 | Madhu et al. | 326/71 |

FOREIGN PATENT DOCUMENTS

| | | | |
|---|---|---|---|
| 002612350 A1 | 9/1988 | France | 326/71 |
| 002130833 | 6/1984 | United Kingdom | 326/71 |

OTHER PUBLICATIONS

Floyd, "Electronic Devices", Charles E. Merrill Publishing Company, pp. 605–608, 1984.

*Primary Examiner*—Michael Tokar
*Assistant Examiner*—Daniel D. Chang
*Attorney, Agent, or Firm*—George O. Saile; Stephen B. Ackerman

[57] ABSTRACT

A circuit and a method are disclosed for a Schmitt trigger stage which converts transistor-transistor logic (TTL) into metal oxide semiconductor (MOS) logic signal levels using all MOS devices. The circuit reduces the standby current of the n-channel transistor of the input section of the Schmitt trigger stage by adding a MOS diode to the bottom the input section. When higher than normal supply voltages are used, the standby current of the p-channel transistor of the input section can be reduced by adding a MOS diode to the top of the input section. In addition, a small MOS transistor, connected across the output Schmitt trigger inverter, eliminates leakage currents in that inverter.

6 Claims, 4 Drawing Sheets

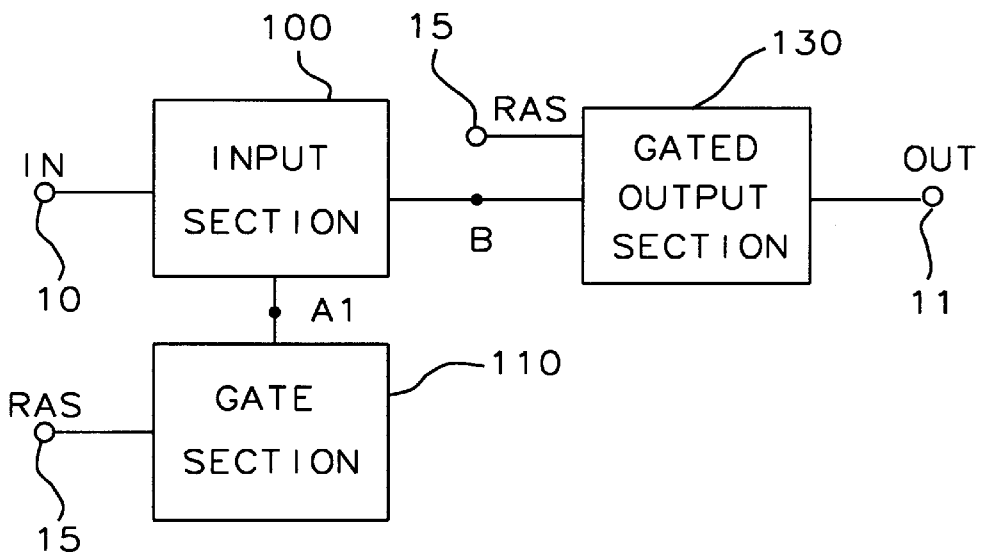
FIG. 1 – Prior Art
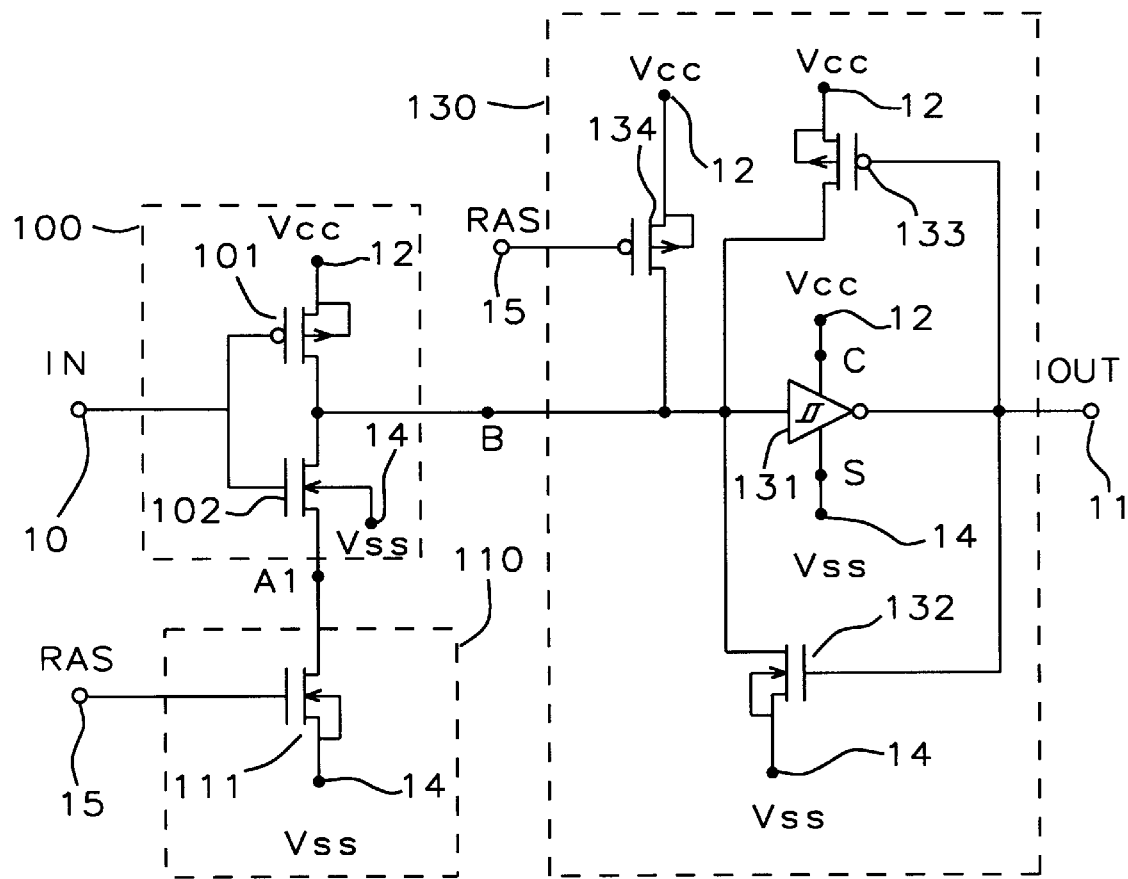
FIG. 2 – Prior Art

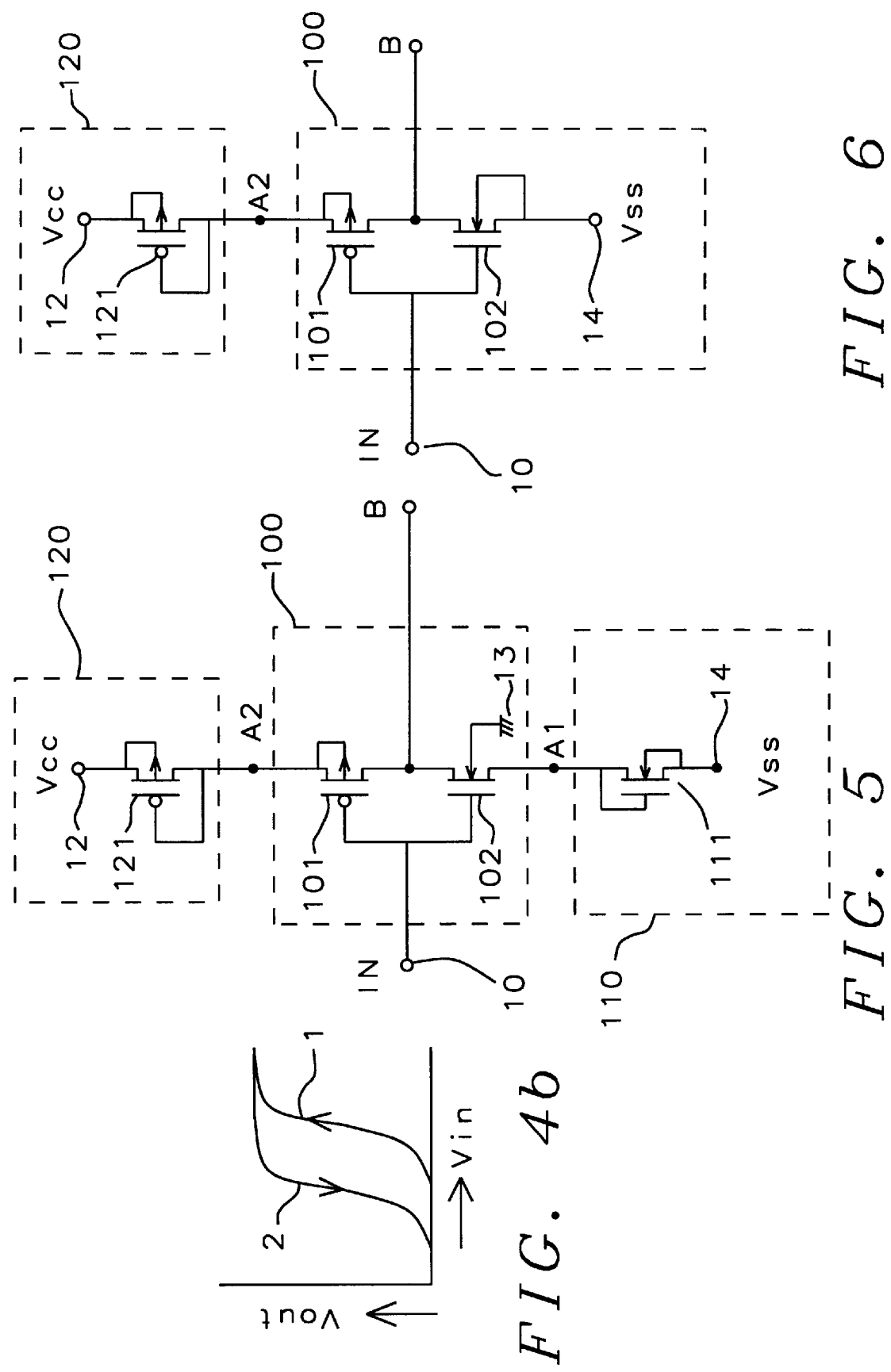

SCHMITT TRIGGER INPUT STAGE

BACKGROUND OF THE INVENTION

1. Field of the Invention

The invention relates to integrated logic circuits, and particularly to MOS logic circuits converting TTL levels to MOS logic levels.

2. Description of the Related Art

Conventional transistor-transistor logic (TTL) to metal oxide semiconductor (MOS) converters implemented in complimentary MOS (CMOS) technology suffer from high standby currents or high through-currents or both. A cause of high standby current is when the most positive down level, or logical "0", at up to 0.8 V biases the n-channel transistor of the CMOS transistor pair to a conduct slightly when it should not. Another cause for a high standby current is when the positive voltage supply is about 0.8 V higher than the up level, or logical "1", biasing the p-channel transistor of the CMOS pair slightly on. High through-current occurs when both n-channel and p-channel transistors of the CMOS transistor pair are conducting when the TTL input signal swings from one logic level to the other. Methods to eliminate high standby currents and through-currents include adding control inputs and, thereby, circuit delays. Other methods add numerous circuit elements increasing circuit complexity and circuit delay, and requiring considerably more silicon real estate.

FIG. 1 shows a high level block diagram of such a converter, where input section 100 is connected to the gated output section 130 through terminal B and gate section 110 is connected to input section 100 through terminal A1. Input section 100 receives input 10 (IN), while both gate section 110 and gated output section 130 receive input 15 (RAS) as input. Gated input section 130 is connected to output 11 (OUT).

FIG. 2 is a detailed diagram of FIG. 1 where each numeral of FIG. 1 designates the same member in FIG. 2. Input section 100 consists of a p-channel transistor 101 and an n-channel transistor 102 connected in series between supply voltage 12 ($V_{CC}$) and terminal A1. The gates of both transistors are connected to input 10 and the connection between the two transistors is terminal B. Together the two transistors form a complimentary MOS (CMOS) transistor pair. The substrate of transistor 101 is connected to the supply voltage 12 ($V_{CC}$) and the substrate of transistor 102 is connected to reference potential 14 ($V_{SS}$). Input 15 is connected to the gate of n-channel transistor 111 and its drain-source is connected between terminal A1 and reference potential 14.

The gated output section 130 consists of the gate transistor 134 and a Schmitt trigger 131, with transistors 132 and 133 determining the turn-on and turn-off characteristics. N-channel transistor 134 has its source-drain connected between supply voltage 12 and terminal B, its gate is connected to input 15. When input 15 goes negative transistor 134 conducts and pulls up terminal B, thus disabling output section 130. N-channel transistor 132 has its drain connected to terminal B, while source and substrate are connected to reference potential 14. The gate of transistor 132 is connected to output 11. N-channel transistor 132 starts conducting when the signal at output 11 goes up, pulling the input of Schmitt trigger 131 down, thus increasing the sensitivity of the Schmitt trigger. P-channel transistor 133 has its source-drain connected between supply voltage 12 and terminal B, and its gate to output 11. P-channel transistor 133 starts conducting when the signal at output 11 goes down, pulling the input of Schmitt trigger 131 up, making the Schmitt trigger less sensitive to signal fluctuations at its input.

A TTL-to-MOS converter is described in U.S. Pat. No. 4,437,025 (Liu et al.) which uses an enhancement mode transistor connected as a diode and a combination of depletion and enhancement mode transistors in the rest of the circuit. U.S. Pat. No. 4,568,844 (O'Connor) discloses an inverter level-shifter circuit for TTL-to-MOS interfacing, having an input stage with an active depletion and enhancement mode transistor input and a depletion mode, diode wired, load transistor. U.S. Pat. No. 5,455,520 (Honda) provides a TTL-CMOS input circuit which uses a control circuit connected to the input terminal to reduce current consumption during intermediate states of the input signal.

SUMMARY OF THE INVENTION

It is an object of the present invention to provide a Schmitt trigger circuit and a method to convert transistor-transistor logic (TTL) into metal oxide semiconductor (MOS) logic signal levels using all MOS devices.

Another object of the present invention is to provide a circuit and a method to eliminate standby currents and, thus, reduce circuit power consumption.

A further object of the present invention is to reduce circuit delays and to allow higher than normal supply voltages.

These objects have been achieved by removing control inputs and using MOS diodes instead to control standby currents. In addition a small N-MOS transistor, acting as a feedback across the Schmitt trigger and having its source and substrate tied to ground, eliminates leakage currents in the Schmitt trigger.

BRIEF DESCRIPTION OF THE DRAWINGS

FIG. 1 is a block diagram of a prior art circuit.

FIG. 2 is the circuit diagram of FIG. 1.

FIG. 4b is a graph of a Schmitt trigger hysteresis curve.

FIG. 5 is a circuit diagram of an alternate embodiment of a portion of the present invention.

FIG. 6 is a circuit diagram of yet another embodiment of a portion of the present invention.

DESCRIPTION OF THE PREFERRED EMBODIMENT

Figure 3:
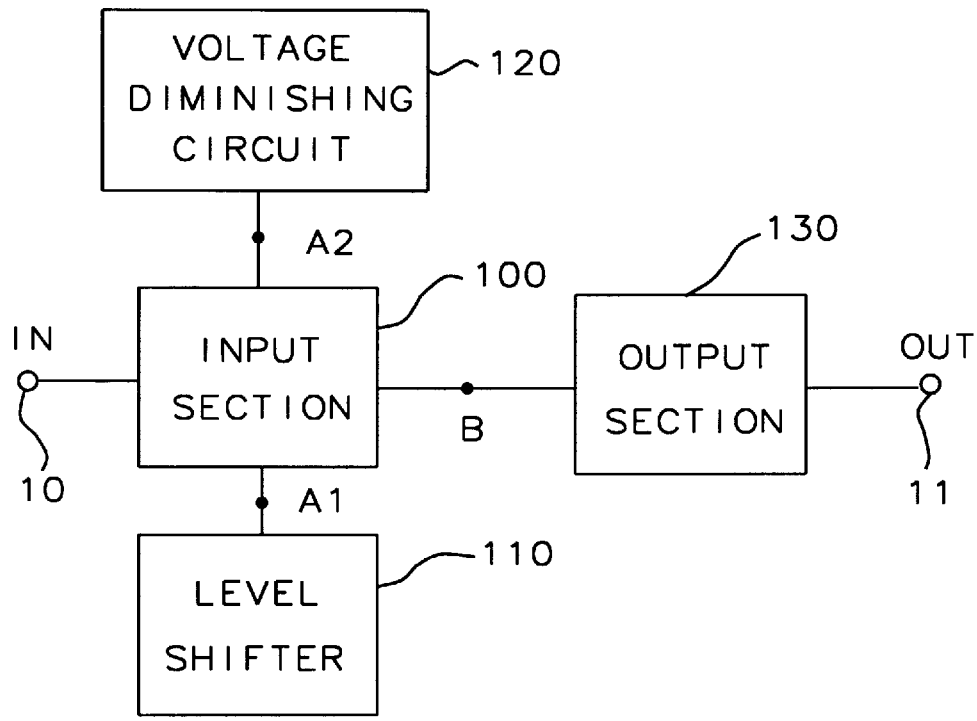
FIG. 3 is a block diagram of the present invention.

Referring now to FIG. 3, we show a circuit depicting the present invention. The function of the disclosed circuit is to convert transistor-transistor logic (TTL) input signals into metal oxide semiconductor (MOS) output signals using only MOS devices, and to reduce the standby current of the circuit without requiring a control input. Block 100 represents the input section with input 10 and output terminal B. Input 10 (IN) accepts TTL signal levels. Attached to input section 100 is terminal A1 and in one embodiment terminal A2. Terminal A1 connects input section 100 with level shifter 110. In another embodiment of the invention terminal A2 connects to a voltage diminishing circuit 120. Output section 130 is connected to terminal B and to output 11 (OUT). Output 11 produces signal levels compatible with MOS devices.

Figure 4A:
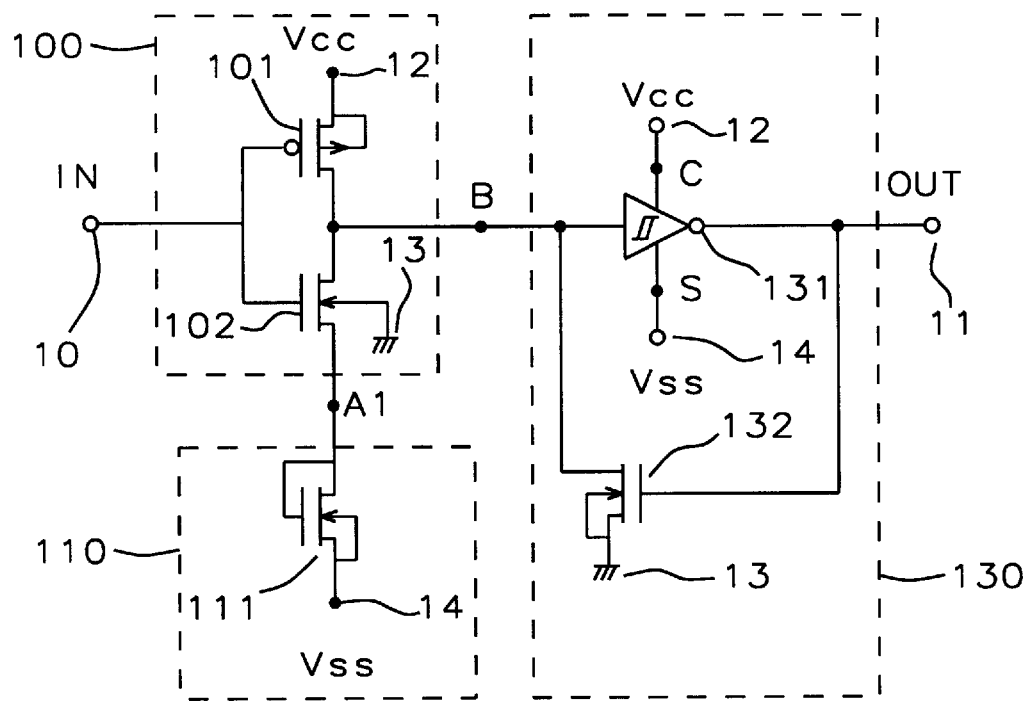
FIG. 4a is a circuit diagram of one embodiment of FIG. 3.

FIG. 4a shows one embodiment of the present invention where only level shifter 110 is attached to input section 100. The TTL input signal has a most negative up level and a most positive down level, the latter having a maximum value of 0.8 V. Input section 100 consists of a p-channel transistor 101 and an n-channel transistor 102 connected in series between supply voltage 12 ($V_{CC}$) and terminal A1. The gates of both transistors are connected to input 10 and the connection between the two transistors forms output terminal B. Together the two transistors form a complimentary MOS (CMOS) transistor pair. The substrate of transistor 102 is connected to ground 13. The n-channel transistor 111 of level shifter 110 has its gate connected to its drain thus acting as a MOS diode and is connected between terminal A1 and reference potential 14 ($V_{SS}$).

The purpose of level shifter 110 is to raise the voltage at the source of transistor 102 sufficiently, that when the input signal is at its most positive down level of 0.8 V, transistor 102 is in its non-conducting state thus reducing its leakage current to typically 39 nA, but ranging from 6 nA to 4.1 $\mu$A. Without the MOS diode action of transistor 111 (i.e. if transistor 102 were tied to reference potential 14) and when the input is at 0.83 V, transistor 102 would be just turning on and conducting a high standby current through transistor 101, thus, increasing circuit power consumption.

The output section 130 comprises an inverting MOS Schmitt trigger 131, its input and output connected between terminal B and output 11 respectively. Terminal C and terminal S of Schmitt trigger 131 are connected to supply voltage 12 and reference potential 14 respectively. The typical hysteresis curve of a Schmitt trigger is shown in FIG. 4b, where Curves 1 and 2 demonstrate that $V_{out}$ relates to $V_{in}$ differently when $V_{in}$ rises than when it falls. N-channel transistor 132 has its drain connected to terminal B, source and substrate are connected to ground potential 13, while the gate is connected to output 11. N-channel transistor 132 serves two functions. The first function is to move Curve 2 of FIG. 4b to the left, thus increasing the sensitivity of Schmitt trigger 131. This may be desirable to counteract the higher trigger level of input section 100 brought on by level shifter 110. The second and more important function is to pull the input of inverter 131 to a voltage close to ground, ranging from 1 $\mu$V to 13 mV, when input 10 is at the TTL up level. Pulling the input of inverter 131 to a voltage close to ground is achieved, as already mentioned, by connecting the substrate and source of transistor 132 to ground 13. Transistor 132 is small and the latching-up action can, therefore, be overcome by the output of input section 100 when the signal at input 10 drops to the TTL down level. But if low $V_{th}$ devices are used then pull-down function of n-channel transistor 132 is not needed because $V_{th}$ is typically 0.45 V.

FIG. 5 shows another embodiment of the present invention where input section 100 is not only attached to level shifter 110 through terminal A1, but also to a voltage diminishing circuit 120 through terminal A2. The function of circuit 120 is to prevent leakage currents in input section 100 when the supply voltage $V_{CC}$ at point 12 ranges from 2.5 V to 3.3 V. Input section 100 and level shifter 110 are identical to input section 100 and level shifter 110 described above and like numerals in FIG. 5 and FIG. 4a indicate like members, except that the source of transistor 101 is connected to terminal A2 instead of voltage supply 12. Voltage diminishing circuit 120 consists of p-channel transistor 121 whose source is connected to voltage supply 12 and whose drain and gate are connected to terminal A2. This transistor acts as a MOS diode and produces a voltage drop across its source-drain. Output section 130 (not shown) is identically connected to output terminal B, and functions in the exactly the same as described earlier.

Still referring to FIG. 5, the purpose of voltage diminishing circuit 120 is to lower the voltage at the source (equal to terminal A) of transistor 101 sufficiently, so that when the input signal is at its most negative up level of 2.0 V and when the voltage supply is in the range of 2.5 V to 3.3 V, transistor 101 is in its non-conducting state, thus reducing leakage currents to typically 0.15 $\mu$A, but ranging from 0.05 $\mu$A to 38 $\mu$A. Without the MOS diode action of transistor 121, i.e. if transistor 101 were tied to voltage supply 12, transistor 101 would be conducting a standby current and thus increase circuit power consumption.

This circuit will be of even greater advantage when using a deep submicron process, because in that process a lower internal supply voltage is used resulting in even lower leakage currents.

FIG. 6 depicts yet another embodiment of the present invention. In this embodiment, input section 100 is connected to voltage diminishing circuit 120 through terminal A2, while source and substrate of transistor 102 are connected to reference potential 14. The voltage diminishing circuit 120 of FIG. 6 is identical to the voltage diminishing circuit 120, described in FIG. 5 and functions identically, in that when the up level of the input signal is at its lowest allowed value of 2.0 V and when the voltage supply is in the range of 2.5 V to 3.3 V, transistor 101 is in its non-conducting state and its leakage current is limited to the range of 0.05 $\mu$A to 38 $\mu$A. Output section 130 is identically connected to output terminal B and functions in the exactly the same way as output section 130, described earlier. Since voltage diminishing circuit 120 lowers the trigger level of input section 100, it may be desirable for some applications to compensate for that by adding and connecting p-channel transistor 133 of FIG. 2 to the output section 130 exactly as shown in FIG. 2. Adding of transistor 133 has the effect of moving Curve 1 of FIG. 4b to the right, thus increasing the trigger level.

Figure 7:
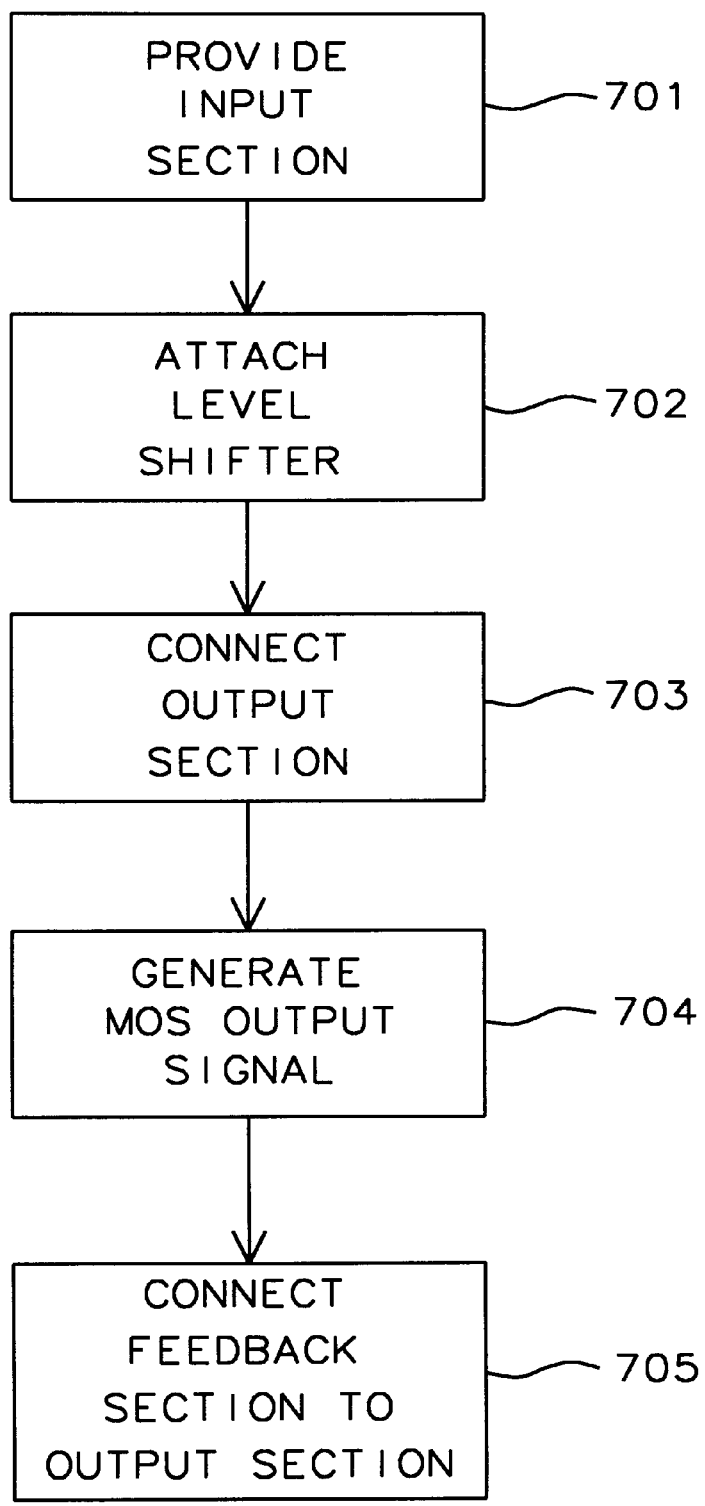
FIG. 7 is a high level block diagram of the method of the present invention.

Referring now to FIG. 7, we show a high level block diagram of the method of reducing the standby current in a Schmitt trigger input stage, comprising exclusively of MOS devices. Block 701 provides an input section which receives TTL input signals. Block 702 attaches a level shifter to the input section of Block 701 which shifts a voltage applied to the source or drain of a MOS device in the input section in such a way that the standby current flowing through the input section is reduced. In Block 703 a Schmitt trigger output section is connected to the input section of Block 701. Block 704 generates a MOS output signal. Block 705 connects a MOS transistor across the output section of Block 704 to reduce the leakage current flowing in the Schmitt trigger output section by pulling to ground the input to the output section (Block 703).

The level shifter of Block 702 is attached between the input section and a reference potential to reduce the standby current when the TTL input signal is at the most positive down level, or the level shifter may be attached between the input section and a voltage supply to reduce the standby current when the TTL input signal is at the most negative up level. In addition, the level shifter of Block 702 may be connected to both ends of the input section of Block 701 to reduce the standby current when the TTL input signal is at either the most positive down level or the most negative up level.

The advantages of the disclosed circuits are that they reduce standby (current for three distinct applications without requiring a control input or other ancillary circuits which would degrade the speed of the claimed Schmitt trigger input stage. These applications are: a) reduce standby current when the TTL input signal is at the most positive down level, b) if the supply voltage is between 2.5 V and 3.3 V, to reduce standby current when the TTL input signal is at the most negative up level, c) reduce standby current flowing in the output section by pulling to ground the input of the output section when the TTL input signal is at a logic up level, and d) the circuit is of great significance for deep submicron processes when a low internal supply voltage is used.

While the invention has been particularly shown and described with reference to the preferred embodiments thereof, it will be understood by those skilled in the art that various changes in form and details may be made without departing from the spirit and scope of the invention.

What is claimed is:

1. A Schmitt trigger input stage using metal oxide semiconductor devices, comprising:
   a supply voltage;
   a reference potential;
   an input section having an input and an output terminal B, for receiving transistor-transistor logic (TTL) signal levels, having a most negative up level and a most positive down level, said most positive down level having a value of 0.8 V;
   a level shifter connected to said input section via a terminal A1, said level shifter shifting voltage levels of said input section, where said level shifter comprises an n-channel transistor having a drain-source path and a gate, said drain-source of said n-channel transistor connected between said terminal A1 and said reference potential, said gate of said n-channel transistor connected to said terminal A1; and
   an output section connected to said output terminal B, said output section providing metal oxide semiconductor (MOS) signal levels.

2. The Schmitt trigger input stage of claim 1, wherein said input section comprises:
   a p-channel transistor having a source-drain path and a gate, said source-drain of said p-channel transistor connected between said supply voltage and said output terminal B, and said gate of said p-channel transistor connected to said input of said input section; and
   an n-channel transistor having a drain-source path, a substrate, and a gate, said drain-source of said n-channel transistor connected between said output terminal B and said terminal A1, said substrate of said n-channel transistor tied to a ground potential, and said gate of said n-channel transistor connected to said input of said input section.

3. A Schmitt trigger input stage using metal oxide semiconductor devices, comprising:
   a supply voltage in the range of 2.5 V to 3.3 V;
   a reference potential;
   an input section having an input and an output terminal B, for receiving transistor-transistor logic (TTL) signal levels, having a most negative up level and a most positive down level, said most positive down level having a value of 0.8 V, and said most negative up level having a value of 2 V;
   a level shifter connected to said input section via a terminal A1, said level shifter shifting voltage levels of said input section, where said level shifter comprises an n-channel transistor having a drain-source path and a gate, said drain-source of said n-channel transistor connected between said terminal A1 and said reference potential, and said gate of said n-channel transistor connected to said terminal A1;
   a voltage diminishing circuit connected to said input section via a terminal A2, said voltage diminishing circuit reducing said supply voltage to said input section, where said voltage diminishing circuit comprises a p-channel transistor having a source-drain path and a gate, said source-drain of said p-channel transistor connected between said supply voltage and said terminal A2, said gate of said p-channel transistor connected to said terminal A2; and
   an output section connected to said output terminal B, said output section providing metal oxide semiconductor (MOS) signal levels.

4. The Schmitt trigger input stage of claim 3, wherein said input section comprises:
   a p-channel transistor having a source-drain path and a gate, said source-drain of said p-channel transistor connected between said terminal A2 and said output terminal B, and said gate of said p-channel transistor connected to said input of said input section; and
   an n-channel transistor having a drain-source path, a substrate, and a gate, said drain-source of said n-channel transistor connected between said output terminal B and said terminal A1, said substrate of said n-channel transistor tied to a ground potential, and said gate of said n-channel transistor connected to said input of said input section.

5. A Schmitt trigger input stage using metal oxide semiconductor devices, comprising:
   a supply voltage in the range of 2.5 V to 3.3 V;
   a reference potential;
   an input section having an input and an output terminal B, for receiving transistor-transistor logic (TTL) signal levels, having a most negative up level and a most positive down level, said most negative up level having a value of 2 V;
   a voltage diminishing circuit connected to said input section via a terminal A2, said voltage diminishing circuit reducing said supply voltage to said input section, where said voltage diminishing circuit comprises a p-channel transistor having a source-drain path and a gate, said source-drain of said p-channel transistor connected between said supply voltage and said terminal A2, said gate of said p-channel transistor connected to said terminal A2; and
   an output section connected to said output terminal B, said output section providing metal oxide semiconductor (MOS) signal levels.

6. The Schmitt trigger input stage of claim 5, wherein said input section comprises:
   a p-channel transistor having a source-drain path and a gate, said source-drain of said p-channel transistor connected between said terminal A2 and said output terminal B, said gate of said p-channel transistor connected to said input of said input section; and
   an n-channel transistor having a drain-source path and a gate, said drain-source of said n-channel transistor connected between said output terminal B and said reference potential, and said gate of said n-channel transistor connected to said input of said input section.

* * * * *